United States Patent
Woo et al.

(10) Patent No.: US 11,019,736 B2
(45) Date of Patent: May 25, 2021

(54) ELECTRONIC DEVICE INCLUDING FLEXIBLE PRINTED CIRCUIT BOARD

(71) Applicant: SAMSUNG ELECTRONICS CO., LTD., Suwon-si (KR)

(72) Inventors: Jeong Woo, Suwon-si (KR); Kwonho Song, Suwon-si (KR); Seungki Choi, Suwon-si (KR); Youngsik Choi, Suwon-si (KR); Soyoung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/567,280

(22) Filed: Sep. 11, 2019

(65) Prior Publication Data

US 2020/0093012 A1    Mar. 19, 2020

(30) Foreign Application Priority Data

Sep. 13, 2018   (KR) ........................ 10-2018-0109410

(51) Int. Cl.
*H05K 5/00* (2006.01)
*H01R 12/79* (2011.01)

(52) U.S. Cl.
CPC .......... *H05K 5/0069* (2013.01); *H01R 12/79* (2013.01); *H05K 2201/04* (2013.01); *H05K 2201/05* (2013.01)

(58) Field of Classification Search
CPC ............. H05K 5/0069; H05K 2201/04; H05K 2201/05; H05K 1/147; H05K 2201/0311;
(Continued)

(56) References Cited

U.S. PATENT DOCUMENTS 5,727,971 A * 3/1998 Junkins .............. H01R 13/6593
439/499
6,040,624 A * 3/2000 Chambers ........... H01L 23/4985
257/668
(Continued)

FOREIGN PATENT DOCUMENTS

KR    10-2018-0028286    3/2018

OTHER PUBLICATIONS

Extended Search Report dated Jan. 31, 2020 in counterpart European Patent Application No. EP19196753.8.

*Primary Examiner* — Hung S. Bui
*Assistant Examiner* — Sagar Shrestha
(74) *Attorney, Agent, or Firm* — Nixon & Vanderhye P.C.

(57) ABSTRACT

Disclosed is an electronic device. An electronic device according to an embodiment may include: a housing including a first plate oriented in a first direction, a second plate oriented in a second direction opposite the first direction, and a side face surrounding a space between the first plate and the second plate; a first PCB disposed in the space and including a first face oriented in the first direction, a second face oriented in the second direction, and a first electrical connector disposed on the first face; a second PCB disposed in the space closer to the second plate than the first PCB, and including a second electrical connector; a third electrical connector detachably coupled to the first electrical connector; a fourth electrical connector detachably coupled to the second electrical connector; an FPCB electrically connected between the third connector and the fourth electrical connector, and including a first portion facing the second face; and a flexible conductive member comprising a conductor disposed between the second face and the first portion.

20 Claims, 16 Drawing Sheets

(58) Field of Classification Search
CPC ........... H05K 2201/0314; H05K 1/028; H05K 2201/042; H05K 3/365; H05K 1/189; H01R 12/79; G06F 1/1686; G06F 1/1658
See application file for complete search history.

(56) References Cited

U.S. PATENT DOCUMENTS

| | | | |
|---|---|---|---|
| 8,651,900 B1 | 2/2014 | Hsu | |
| 2001/0012706 A1* | 8/2001 | Imaeda | H05K 3/321 439/66 |
| 2009/0027816 A1* | 1/2009 | Kim | H01R 13/6485 361/56 |
| 2012/0021621 A1* | 1/2012 | Kim | H05K 1/028 439/65 |
| 2014/0097021 A1* | 4/2014 | Su | H05K 9/0066 174/72 R |
| 2016/0322724 A1* | 11/2016 | Lee | H01R 12/771 |
| 2017/0006738 A1* | 1/2017 | Lee | G02F 1/13452 |
| 2017/0047791 A1* | 2/2017 | Jang | H01F 38/14 |
| 2017/0271799 A1* | 9/2017 | Axelowitz | H01R 12/79 |
| 2018/0035532 A1 | 2/2018 | Chen | |
| 2018/0065035 A1* | 3/2018 | Yamazaki | A63F 13/98 |
| 2018/0307270 A1* | 10/2018 | Pantel | H04M 1/0266 |

* cited by examiner

ELECTRONIC DEVICE INCLUDING FLEXIBLE PRINTED CIRCUIT BOARD

CROSS-REFERENCE TO RELATED APPLICATION

This application is based on and claims priority under 35 U.S.C. 119 to Korean Patent Application No. 10-2018-0109410, filed on Sep. 13, 2018, in the Korean Intellectual Property Office, the disclosure of which is incorporated by reference herein in its entirety.

BACKGROUND

1) Field

The disclosure relates to an electronic device including a flexible circuit board.

2) Description of Related Art

With the development of technology, an electronic device may include therein electronic components that perform various functions. The electronic components may be connected to a connector for connection with a main printed circuit board (PCB) of the electronic device. The connector may be variously selected depending on the function thereof. The electronic components may be connected to the main PCB with a connector so as to receive power or to transmit/receive signals.

Electronic devices tend to become smaller and smaller according to users' demand. Electronic components may be arranged in a narrow space in an electronic device to have a structure for dissipating heat generated in the electronic components, and may release heat using a conductive material included therein.

In an electronic device, a connector may be used to connect electronic components to each other or to connect an electronic component to a main PCB. A connector of an electronic device may be variously formed depending on the structure and function of an electronic component. According to the users' preference for small electronic devices, the size of mounting spaces inside the electronic devices may be reduced. In an electronic device, the sizes or number of connectors for connection between electronic components disposed therein or between electronic components and a PCB may be reduced. A small electronic device includes various electronic components therein, and high-performance electronic components disposed in a narrow space may generate significant heat.

The above information is presented as background information only to assist with an understanding of the disclosure. No determination has been made, and no assertion is made, as to whether any of the above might be applicable as prior art with regard to the disclosure.

SUMMARY

Various embodiments of the disclosure provide an electronic device that is capable of ensuring an inner mounting space and includes a flexible printed circuit board (FPCB) capable of discharging heat.

An electronic device according to various example embodiments may include: a housing including a first plate oriented in a first direction, a second plate oriented in a second direction opposite the first direction, and a side face surrounding a space between the first plate and the second plate; a first printed circuit board (PCB) disposed in the space and including a first face oriented in the first direction, a second face oriented in the second direction, and a first electrical connector disposed on the first face; a second PCB disposed in the space closer to the second plate than the first PCB, and including a second electrical connector; a third electrical connector detachably coupled to the first electrical connector; a fourth electrical connector detachably coupled to the second electrical connector; a flexible printed circuit board (FPCB) electrically connected between the third electrical connector and the fourth electrical connector, and including a first portion facing the second face of the first PCB; and a flexible conductive member comprising a conductor disposed between the second face and the first portion.

An electronic device according to various example embodiments may include: a housing including an inner space; a PCB disposed in the inner space and having a plate shape including a first face and a second face, the PCB including a first electrical connector disposed on the first face; an FPCB including a second electrical connector coupled to the first electrical connector and connected to an end thereof, and an electronic component electrically connected to the PCB and spaced apart from the second face; and a flexible conductive member comprising a conductor disposed between the second face and the FPCB. The second electrical connector may be electrically connected to a signal transmission line and a first power transmission line, and the flexible conductive member may be electrically connected to a second power transmission line.

With an electronic apparatus according to various example embodiments, it is possible to reduce the number of pins of connectors and to reduce the mounting space of the connectors by applying different types of connectors to a single FPCB depending on the functions thereof.

With an electronic device according to various example embodiments, it is possible to prevent and/or reduce deterioration of antenna performance by not placing high-current wiring in a bezel area thereof used as an antenna area.

With an electronic device according to various example embodiments, it is possible to dissipate heat generated by reducing a flow path of heat generated in an electronic component due to a high current.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
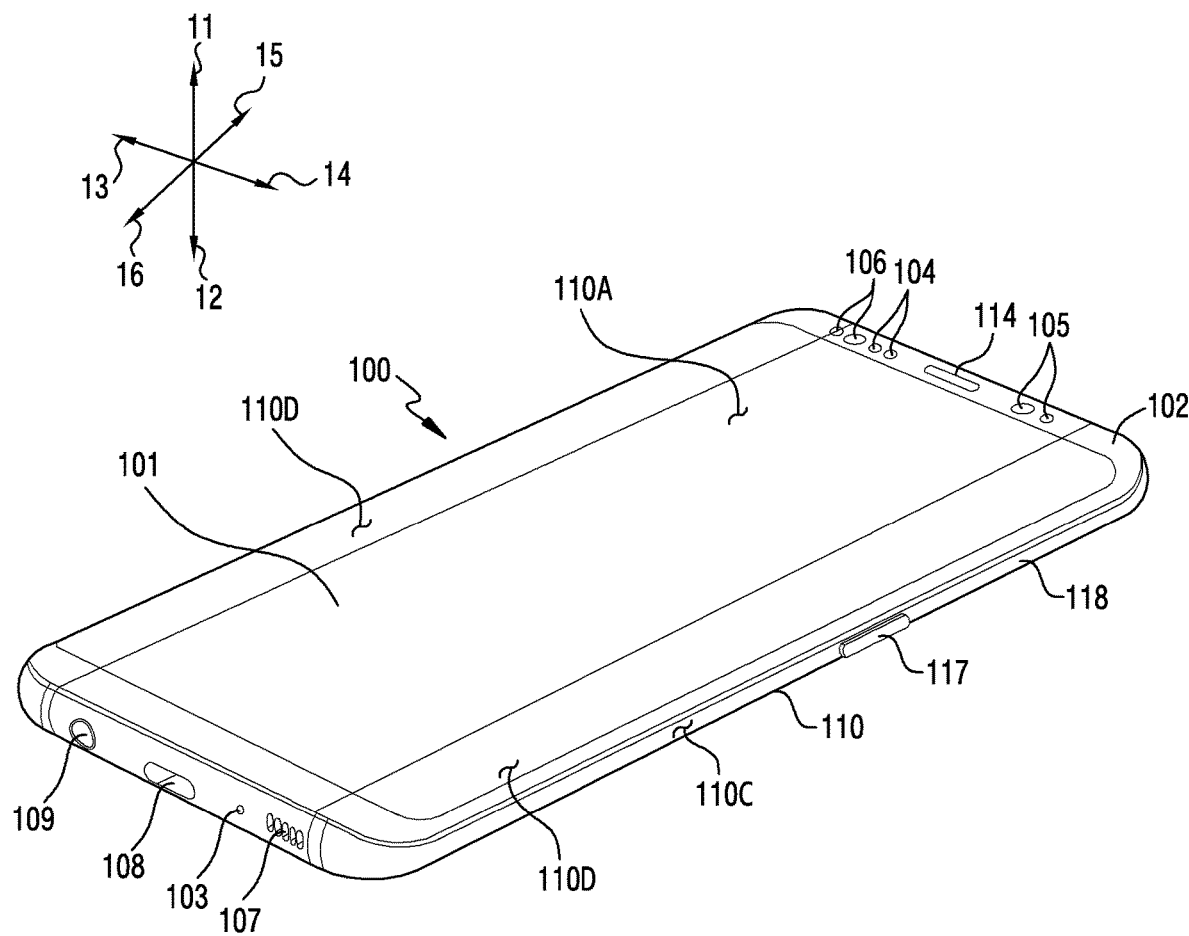
FIG. 1 is a front side perspective view illustrating an example mobile electronic device according to an embodiment.
Figure 2:
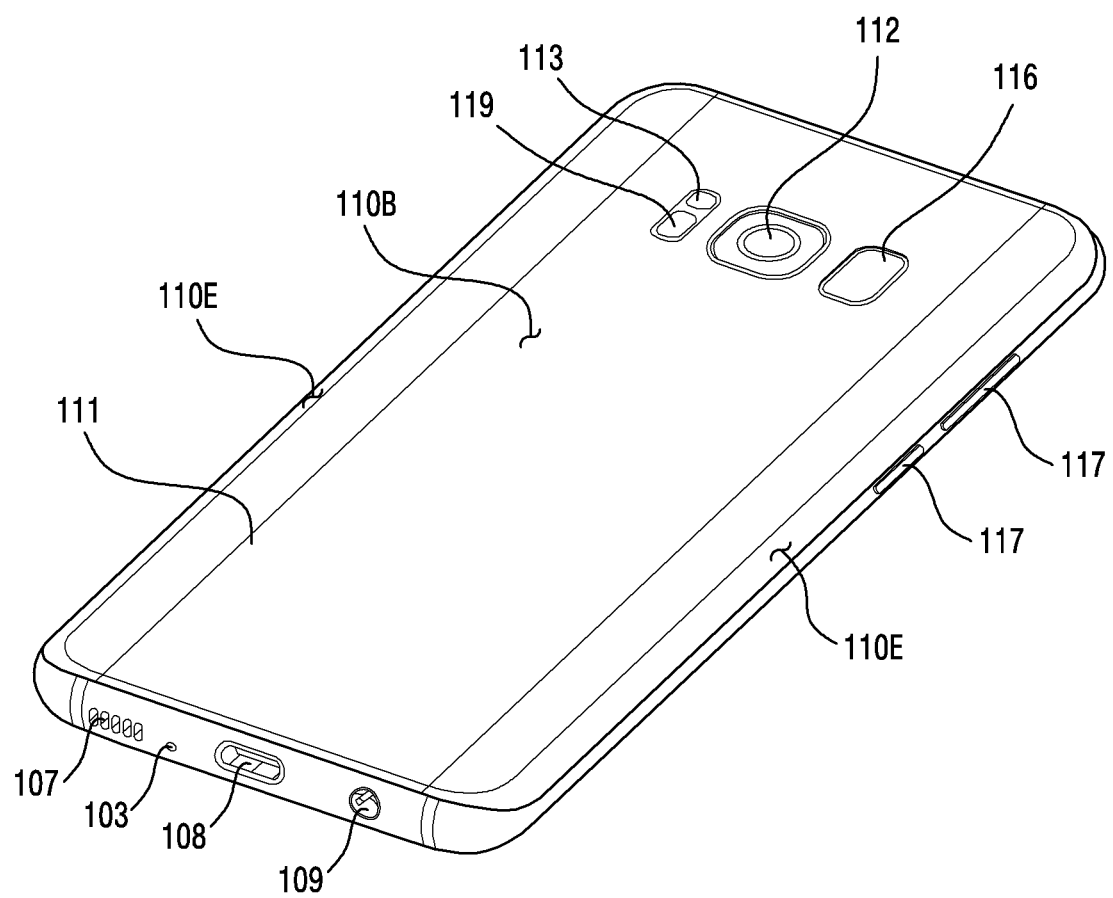
FIG. 2 is a rear side perspective view of the electronic device of FIG. 1.
Figure 3:
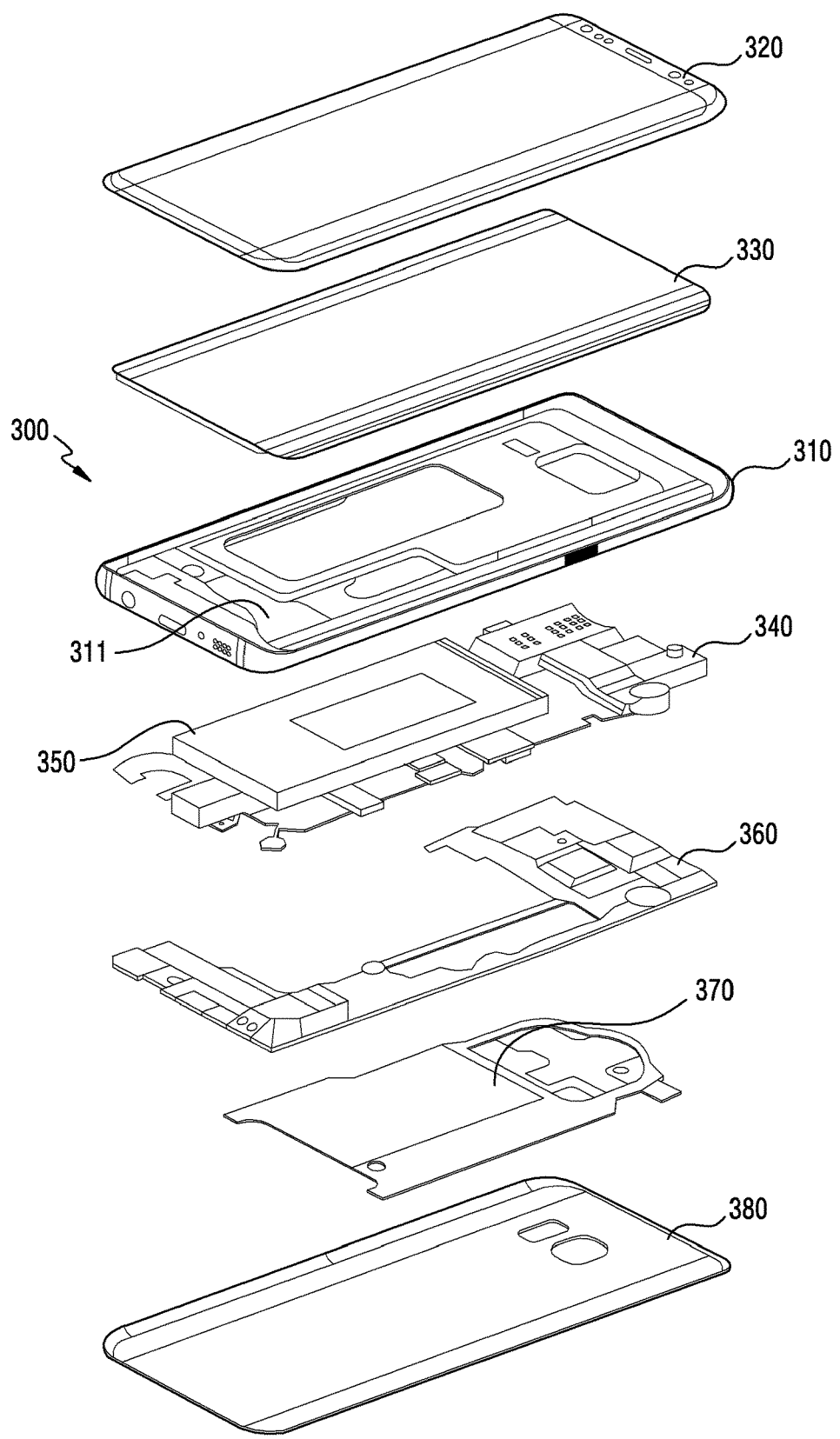
FIG. 3 is an exploded perspective view of the electronic device of FIG. 1.

FIG. 1 is a front side perspective view illustrating an example mobile electronic device according to an embodiment, FIG. 2 is a rear side perspective view of the electronic device of FIG. 1, and FIG. 3 is an exploded perspective view of the electronic device of FIG. 1.

Referring to FIGS. 1 and 2, an electronic device 100 according to an embodiment may include: a housing 110 including a first face (or a front face) 11A, a second face (or a rear face) 110B, and a side face 110C surrounding the space between the first face 110A and the second face 110B. In another embodiment (not illustrated), the term "housing" may refer to a structure forming some of the first face 110A, the second face 110B, and the side face 110C of FIG. 1. According to an embodiment, at least a portion of the first face 110A may be formed of a substantially transparent front plate 102 (e.g., a glass plate or a polymer plate including various coating layers). The second face 110B may be formed of a substantially opaque rear plate 111. The rear plate 111 may be formed of, for example, and without limitation, coated or colored glass, ceramic, a polymer, a metal (e.g., aluminum, stainless steel (STS), or magnesium), or a combination of two or more of these materials. The side face 110C may be formed by a side bezel structure (or a "side member") 118 coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include two first areas 110D, which are bent from the first face 110A toward the rear plate 111 and extend seamlessly, at the long opposite side edges thereof. In the illustrated embodiment (see FIG. 2), the rear plate 111 may include two second areas 110E, which are bent from the second face 110B toward the front plate 102 and extend seamlessly, at the long opposite side edges thereof. In some embodiments, the front plate 102 (or the rear plate 111) may include only one of the two first areas 110D (or the two second areas 110E). In another embodiment, some of the first areas 110D and the second areas 110E may not be included. In the above-described embodiments, when viewed from a side of the electronic device 100, the side bezel structure 118 may have a first thickness (or width) on the side faces that do not include the first areas 110D or the second areas 110E, and may have a second thickness (or width), which is smaller than the first thickness, on the side faces that include the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, light-emitting elements 106, and connector holes 108 and 109. In some embodiments, in the electronic device 100, at least one of the components (e.g., the key input devices 117 or the light-emitting element 106) may be omitted, or other components may be additionally included.

The display 101 may be exposed through, for example, a large portion of the front plate 102. In some embodiments, at least a part of the display 101 may be exposed through the front plate 102 forming the first face 110A and the first areas 110D of the side face 110C. In some embodiments, the edges of the display 101 may be formed to be substantially the same as the contour shape of the front plate 102 adjacent thereto. In another embodiment (not illustrated), the distance between the outer contour of the display 101 and the outer contour of the front plate 102 may be substantially constant in order to enlarge the exposed area of the display 101.

In another embodiment (not illustrated), a recess or an opening may be formed in a part of a screen display area of the display 101, and at least one of an audio module 114, a sensor module 104, a camera module 105, and a light-emitting element 106 may be aligned with the recess or the opening. In another embodiment (not illustrated), at least one of the audio module 114, the sensor module 104, the camera module 105, the fingerprint sensor 116, and the light-emitting element 106 may be included in the rear face of the screen display area of the display 101. In another embodiment (not illustrated), the display 101 may be coupled to or disposed adjacent to a touch-sensing circuit, a pressure sensor that is capable of measuring the intensity of the touch (pressure), and/or a digitizer that detects a magnetic-field-type stylus pen. In some embodiments, at least some of the sensor modules 104 and 119 and/or at least some of the key input devices 117 may be disposed in the first areas 110D and/or the second areas 110E.

The audio modules 103, 107, and 114 may include a microphone hole 103 and speaker holes 107 and 114. The microphone hole 103 may include a microphone disposed therein so as to acquire external sound, and in some embodiments, multiple microphones may be disposed therein so as to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included therein without the speaker holes 107 and 114 (e.g., a piezo speaker).

The sensor modules 104, 116, and 119 may generate electrical signals or data values corresponding to the internal operating state or the external environmental state of the electronic device 100. The sensor modules 104, 116, and 119 may include, for example, a first sensor module 104 (e.g., a proximity sensor) and/or a second sensor module (not illustrated) (e.g., a fingerprint sensor) disposed on the first face 110A of the housing 110, and/or a third sensor module 119 (e.g., an HRM sensor) and/or a fourth sensor module 116 (e.g., a fingerprint sensor) disposed on the second face 110B of the housing 110. The fingerprint sensor may be disposed not only on the first face 110A of the housing 110 (e.g., display 101), but also on the second face 110B. The electronic device 100 may further include at least one of sensors (not illustrated) such as, for example, and without limitation, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, an illuminance sensor, or the like.

The camera modules 105, 112, and 113 may include a first camera device 105 disposed on the first face 110A of the electronic device 100 and a second camera device 112 disposed on the second face 110B, and/or a flash 113. The camera devices 105 and 112 may include one or more lenses, an image sensor, and/or an image signal processor. The flash 113 may include, for example, a light-emitting diode or a xenon lamp. In some embodiments, two or more lenses (e.g., an infrared camera lens, a wide-angle lens, and a telephoto lens) and image sensors may be disposed on one face of the electronic device 100.

The key input devices 117 may be disposed on the side faces 110C of the housing 110. In another embodiment, the electronic device 100 may not include some or all of the above-mentioned key input devices 117, and a key input device 117, which is not included therein, may be implemented in another form, such as that of a soft key or the like on the display 101. In some embodiments, the key input devices 117 may include a sensor module 116 disposed on the second face 110B of the housing 110.

The light-emitting element 106 may be disposed, for example, on the first face 110A of the housing 110. The light-emitting element 106 may provide, for example, the information about the status of the electronic device 100 in an optical form. In another embodiment, the light-emitting element 106 may provide a light source that is interlocked with, for example, the operation of the camera module 105. The light-emitting element 106 may include, for example, and without limitation, an LED, an IR LED, a xenon lamp, or the like.

The connector holes 108 and 109 may include a first connector hole 108 that is capable of accommodating a connector (e.g., a USB connector) for transmitting and receiving power and/or data to and from an external electronic device, and/or a second connector hole 109 that is capable of receiving a connector (e.g., an earphone jack) for transmitting and receiving an audio signal to and from an external electronic device.

Referring to FIG. 3, an electronic device 300 may include a side bezel structure 310, a first support member 311 (e.g., a bracket), a front plate 320, a display 330, a PCB 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or the electronic device 300 may additionally include other components. At least one of the components of the electronic device 300 may be the same as or similar to at least one of the components of the electronic device 100 of FIG. 1 or 2, and a redundant description may not be repeated here.

The first support member 311 may be disposed inside the electronic device 300 and may be connected to the side bezel structure 310, or may be formed integrally with the side bezel structure 310. The first support member 311 may include, for example, a metal material and/or a non-metal (e.g., polymer) material. The display 330 may be coupled to one face of the first support member 311, and the PCB 340 may be coupled to the other face of the first support member 311. On the PCB 340, a processor, a memory, and/or an interface, or the like, may be mounted. The processor may include various processing circuitry including at least one of, for example, and without limitation, a central processing unit, an application processor, a graphic processor, an image signal processor, a sensor hub processor, a communication processor, or the like.

The memory may include, for example, volatile memory and/or nonvolatile memory.

The interface may include, for example, and without limitation, a high-definition multimedia interface (HDMI), a universal serial bus (USB) interface, an SD card interface, and/or an audio interface, or the like. The interface may electrically or physically connect, for example, the electronic device 300 to an external electronic device, and may include, for example, and without limitation, a USB connector, an SD card/an MMC connector, an audio connector, or the like.

The battery 350 is a device for supplying power to at least one component of the electronic device 300, and may include, for example, and without limitation, a non-rechargeable primary battery, a rechargeable secondary battery, a fuel cell, or the like. At least a portion of the battery 350 may be disposed to be substantially flush with, for example, the PCB 340. The battery 350 may be integrally disposed within the electronic device 300, or may be detachably mounted on the electronic device 300.

The antenna 370 may be disposed between the rear plate 380 and the display 330. The antenna 370 may include, for example, and without limitation, a near-field communication (NFC) antenna, a wireless charging antenna, and/or a magnetic secure transmission (MST) antenna, or the like. The antenna 370 may perform short-range communication with, for example, an external electronic device, or may transmit/receive power required for charging to/from the external device in a wireless manner. In another embodiment, an antenna structure may be formed by the side bezel structure 310, a portion of the first support member 311, or a combination thereof.

Figure 4:
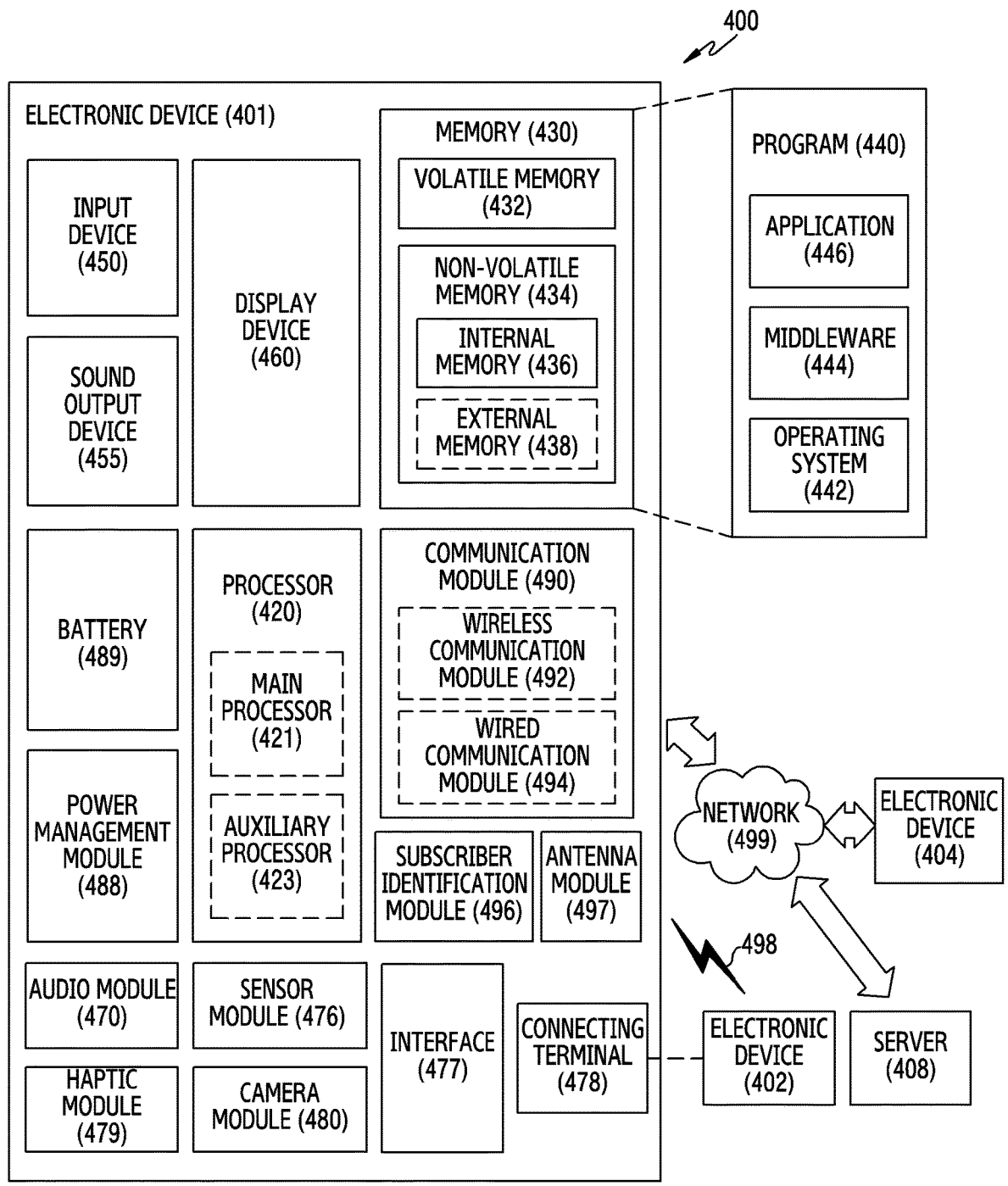
FIG. 4 is a block diagram illustrating an example electronic device in a network environment according to various embodiments.

FIG. 4 is a block diagram illustrating an example electronic device 401 in a network environment 400 according to various embodiments. Referring to FIG. 4, the electronic device 401 in the network environment 400 may communicate with an electronic device 402 via a first network 498 (e.g., a short-range wireless communication network), or an electronic device 404 or a server 408 via a second network 499 (e.g., a long-range wireless communication network). According to an embodiment, the electronic device 401 may communicate with the electronic device 404 via the server 408. According to an embodiment, the electronic device 401 may include a processor 420, memory 430, an input device 450, a sound output device 455, a display device 460, an audio module 470, a sensor module 476, an interface 477, a haptic module 479, a camera module 480, a power management module 488, a battery 489, a communication module 490, a subscriber identification module (SIM) 496, or an antenna module 497. In some embodiments, at least one (e.g., the display device 460 or the camera module 480) of the components may be omitted from the electronic device 401, or one or more other components may be added in the electronic device 401. In some embodiments, some of the components may be implemented as single integrated circuitry. For example, the sensor module 476 (e.g., a fingerprint sensor, an iris sensor, or an illuminance sensor) may be implemented as embedded in the display device 460 (e.g., a display).

The processor 420 may execute, for example, software (e.g., a program 440) to control at least one other component (e.g., a hardware or software component) of the electronic device 401 coupled with the processor 420, and may perform various data processing or computation. According to one embodiment, as at least part of the data processing or computation, the processor 420 may load a command or data received from another component (e.g., the sensor module 476 or the communication module 490) in volatile memory 432, process the command or the data stored in the volatile memory 432, and store resulting data in non-volatile memory 434. According to an embodiment, the processor 420 may include a main processor 421 (e.g., a central processing unit (CPU) or an application processor (AP)), and an auxiliary processor 423 (e.g., a graphics processing unit (GPU), an image signal processor (ISP), a sensor hub processor, or a communication processor (CP)) that is operable independently from, or in conjunction with, the main processor 421. Additionally or alternatively, the auxiliary processor 423 may be adapted to consume less power than the main processor 421, or to be specific to a specified function. The auxiliary processor 423 may be implemented as separate from, or as part of the main processor 421.

The auxiliary processor 423 may control at least some of functions or states related to at least one component (e.g., the display device 460, the sensor module 476, or the communication module 490) among the components of the electronic device 401, instead of the main processor 421 while the main processor 421 is in an inactive (e.g., sleep) state, or together with the main processor 421 while the main processor 421 is in an active state (e.g., executing an application). According to an embodiment, the auxiliary processor 423 (e.g., an image signal processor or a communication processor) may be implemented as part of another component (e.g., the camera module 480 or the communication module 490) functionally related to the auxiliary processor 423.

The memory 430 may store various data used by at least one component (e.g., the processor 420 or the sensor module 476) of the electronic device 401. The various data may include, for example, software (e.g., the program 440) and input data or output data for a command related thereto. The memory 430 may include the volatile memory 432 or the non-volatile memory 434.

The program 440 may be stored in the memory 430 as software, and may include, for example, an operating system (OS) 442, middleware 444, or an application 446.

The input device 450 may receive a command or data to be used by other component (e.g., the processor 420) of the electronic device 401, from the outside (e.g., a user) of the electronic device 401. The input device 450 may include, for example, a microphone, a mouse, or a keyboard.

The sound output device 455 may output sound signals to the outside of the electronic device 401. The sound output device 455 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 460 may visually provide information to the outside (e.g., a user) of the electronic device 401. The display device 460 may include, for example, a display, a hologram device, or a projector and control circuitry to control a corresponding one of the display, hologram device, and projector. According to an embodiment, the display device 460 may include touch circuitry adapted to detect a touch, or sensor circuitry (e.g., a pressure sensor) adapted to measure the intensity of force incurred by the touch.

The audio module 470 may convert a sound into an electrical signal and vice versa. According to an embodiment, the audio module 470 may obtain the sound via the input device 450, or output the sound via the sound output device 455 or a headphone of an external electronic device (e.g., an electronic device 402) directly (e.g., wiredly) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. According to an embodiment, the sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 to be coupled with the external electronic device (e.g., the electronic device 402) directly (e.g., wiredly) or wirelessly. According to an embodiment, the interface 477 may include, for example, a high definition multimedia interface (HDMI), a universal serial bus (USB) interface, a secure digital (SD) card interface, or an audio interface.

A connecting terminal 478 may include a connector via which the electronic device 401 may be physically connected with the external electronic device (e.g., the electronic device 402). According to an embodiment, the connecting terminal 478 may include, for example, a HDMI connector, a USB connector, a SD card connector, or an audio connector (e.g., a headphone connector).

The haptic module 479 may convert an electrical signal into a mechanical stimulus (e.g., a vibration or a movement) or electrical stimulus which may be recognized by a user via his tactile sensation or kinesthetic sensation. According to an embodiment, the haptic module 479 may include, for example, a motor, a piezoelectric element, or an electric stimulator.

The camera module 480 may capture a still image or moving images. According to an embodiment, the camera module 480 may include one or more lenses, image sensors, image signal processors, or flashes.

The power management module 488 may manage power supplied to the electronic device 401. According to one embodiment, the power management module 488 may be implemented as at least part of, for example, a power management integrated circuit (PMIC).

The battery 489 may supply power to at least one component of the electronic device 401. According to an embodiment, the battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the electronic device 402, the electronic device 404, or the server 408) and performing communication via the established communication channel. The communication module 490 may include one or more communication processors that are operable independently from the processor 420 (e.g., the application processor (AP)) and supports a direct (e.g., wired) communication or a wireless communication. According to an embodiment, the communication module 490 may include a wireless communication module 492 (e.g., a cellular communication module, a short-range wireless communication module, or a global navigation satellite system (GNSS)

communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or infrared data association (IrDA)) or the second network 499 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The antenna module 497 may transmit or receive a signal or power to or from the outside (e.g., the external electronic device) of the electronic device 401. According to an embodiment, the antenna module 497 may include an antenna including a radiating element composed of a conductive material or a conductive pattern formed in or on a substrate (e.g., PCB). According to an embodiment, another component (e.g., a radio frequency integrated circuit (RFIC)) other than the radiating element may be additionally formed as part of the antenna module 497. According to an embodiment, the antenna module 497 may include a plurality of antennas. In such a case, at least one antenna appropriate for a communication scheme used in the communication network, such as the first network 498 or the second network 499, may be selected, for example, by the communication module 490 from the plurality of antennas. The signal or the power may then be transmitted or received between the communication module 490 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 401 and the external electronic device 404 via the server 408 coupled with the second network 499. Each of the electronic devices 402 and 404 may be a device of a same type as, or a different type, from the electronic device 401. According to an embodiment, all or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401. The electronic device 401 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, etc. According to an embodiment of the disclosure, the electronic devices are not limited to those described above.

It should be appreciated that various example embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in any other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 440) including one or more instructions that are stored in a storage medium (e.g., internal memory 436 or external memory 438) that is readable by a machine (e.g., the electronic device 401). For example, a processor (e.g., the processor 420) of the machine (e.g., the electronic device 401) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" is a tangible device, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 5:
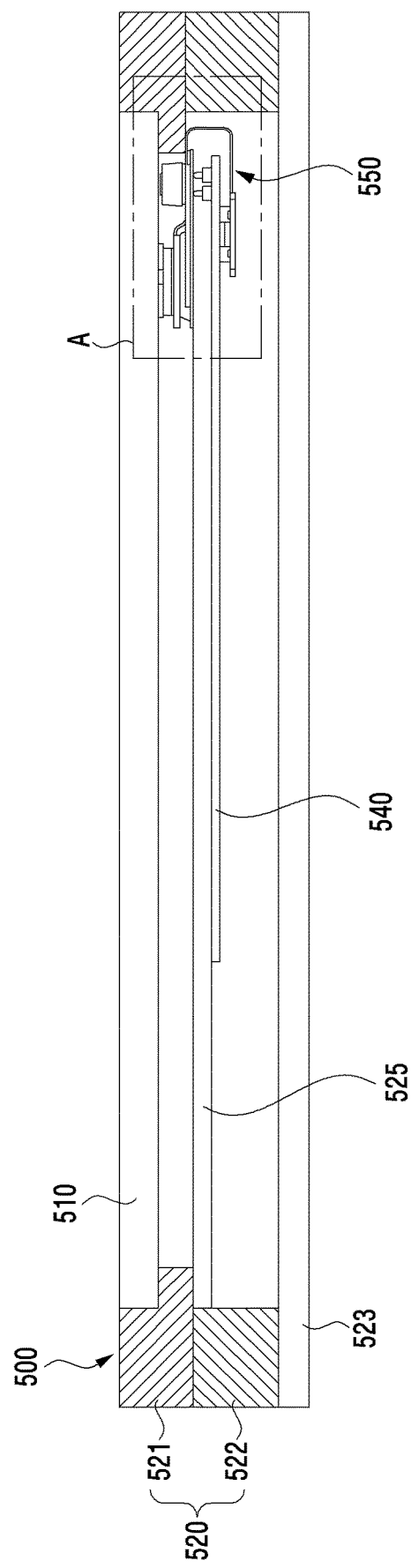
FIG. 5 is a cross-sectional view illustrating an example electronic device according to an embodiment.

FIG. 5 is a cross-sectional view illustrating an example electronic device according to an embodiment.

Referring to FIG. 5, an electronic device 500 may include a first plate 510 (e.g., the front plate 102 in FIG. 1), a second plate 523 (e.g., the rear plate 111 in FIG. 2), a side bezel structure 520, a PCB 540 (e.g., the PCB 340 in FIG. 3), and/or a flexible printed circuit board (FPCB) 550.

The electronic device 500 of FIG. 5 may be the electronic device 100 illustrated in FIG. 1 or an electronic device similar thereto. The cross-sectional view of the electronic device 500 of FIG. 5 may be a cross-sectional view taken by cutting an area including a sensor module (e.g., the sensor module 104 in FIG. 1), a camera module (e.g., the camera module 105 in FIG. 1), or a light-emitting element (e.g., the light-emitting element in FIG. 1).

According to an embodiment, the first plate 510 may form the front face of the electronic device 500. The first plate 510 may include transparent glass and/or a polymer material. The display may be located below the first plate 510.

Light emitted from the display may be transmitted through the first plate 510 to the outside. The user is able to visually recognize information due to the light transmitted to the outside.

According to an embodiment, the side bezel 520 may include a first bezel 521 and a second bezel 522. The first bezel 521 may have a protrusion to support the first plate 510. The first bezel 521 may form a side surface of the electronic device 500 together with the second bezel 522. One end of the second bezel 522 may be coupled to the first bezel 521, the other end of the second bezel 522 may be coupled to the second plate 523. The first bezel 521 and the second bezel 522 may be integrally formed. The side bezel 520 and the bracket 525 may be connected to each other. The bracket 525 may support a display (not illustrated) and an electronic component (not illustrated). The side bezel 520 and the bracket 525 may be integrally formed.

According to an embodiment, the PCB 540 may include a processor, memory, a connector, and leads for signal transmission and power supply. Through the connector connected to the leads, the electronic device 500 is capable of supplying power to the electronic component or is capable of transmitting and receiving signals.

According to an embodiment, the FPCB 550 may include a connector capable of connecting an electronic component and a PCB. An electronic component may, for example, be disposed on the surface of the FPCB 550. An electronic component may, for example, be integrally formed on the surface of the FPCB 550 using surface mount technology (SMT).

Figure 6A:
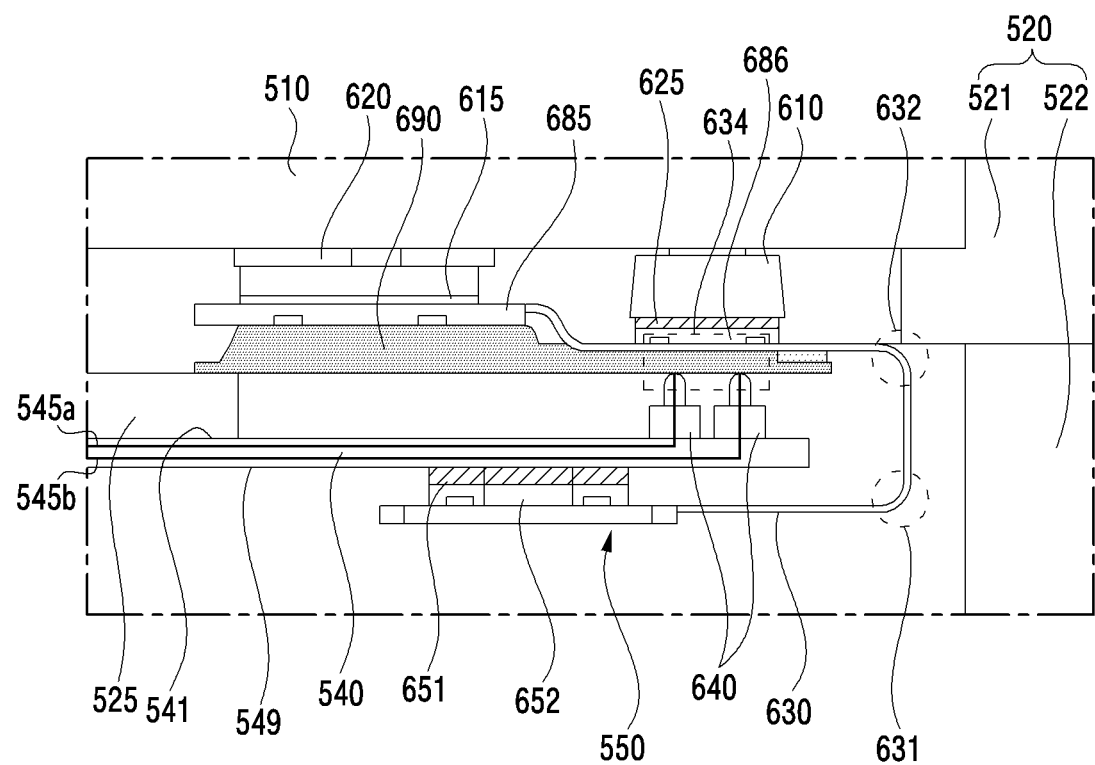
FIG. 6A is an enlarged view of an area A of the electronic device of FIG. 5.
Figure 6B:
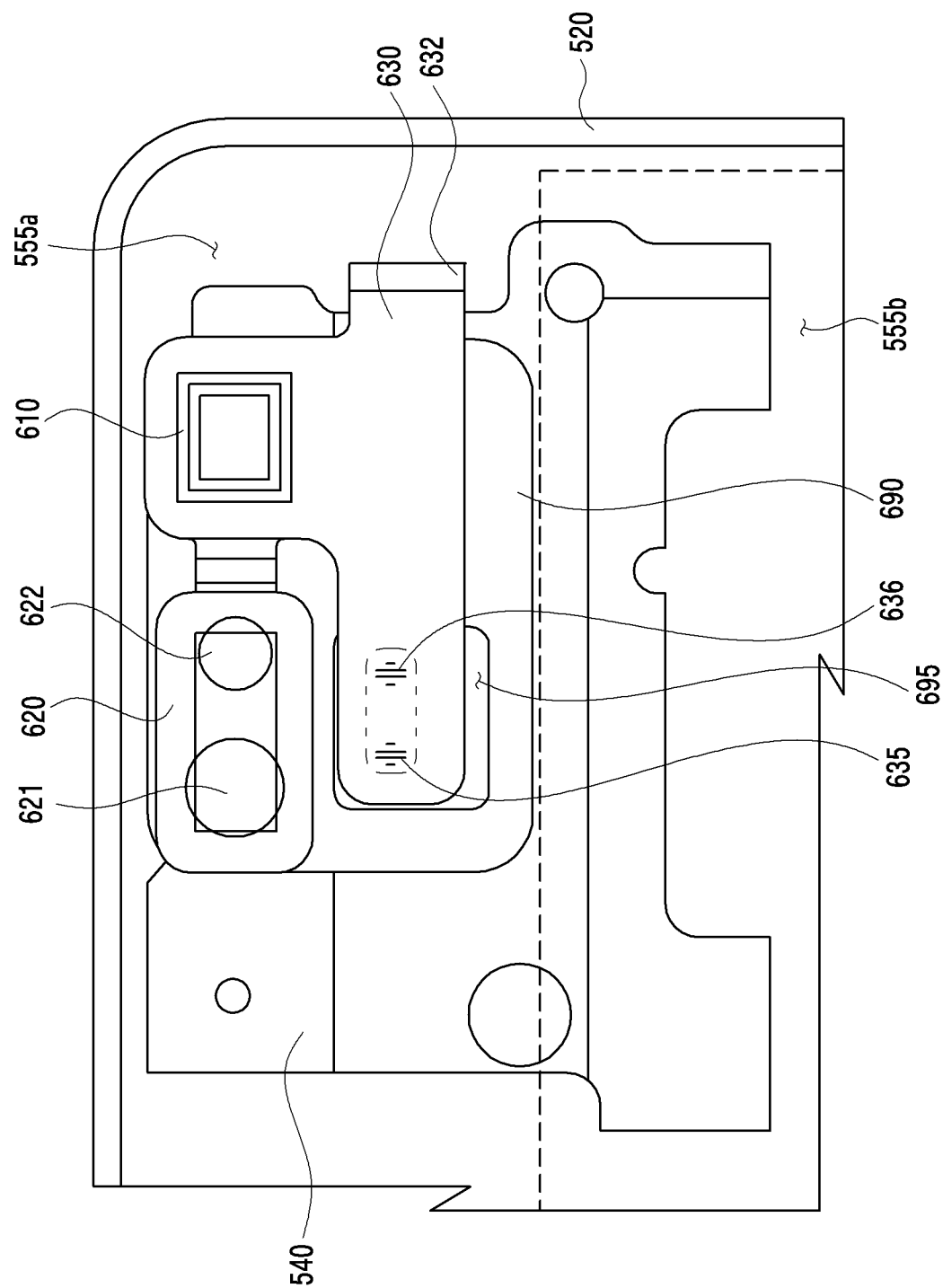
FIG. 6B is a plan view of the area A of the electronic device of FIG. 5.

FIG. 6A is an enlarged view of an area A of the electronic device of FIG. 5, and FIG. 6B is a plan view of the area A of the electronic device of FIG. 5.

Referring to FIGS. 6A and 6B, the PCB 540 may include a first electrical connector 651 and flexible conductive members 640 on the surface thereof. The FPCB 550 may include a first electronic component 610, a second electronic component 620, a bending area 630, and a second electrical connector 652.

According to an embodiment, the first electronic component 610 and the second electronic component 620 of the FPCB 550 may be supported by the bracket 525. The bracket 525 may be coupled with the support plate 690 of the FPCB 550, and the bracket 525 may be coupled with the PCB 540.

According to an embodiment, the PCB 540 includes a first face 541 facing the first plate 510 and a second face 549 facing the second plate 523 (see, e.g., FIG. 5) and positioned on a side opposite the first face 541. The first electrical connector 651 may be positioned on the second face 549 of the PCB 540. The first electronic component 610 and the second electronic component 620 may be disposed to face the first face 541 of the PCB 540. At least a portion of the first face 541 of the PCB 540 may be fixedly coupled to the bracket 525.

According to an embodiment, the first electrical connector 651 and the second electrical connector 652 are coupled to each other such that the first electronic component 610 and the second electronic component 620 are able to be powered from the PCB 540 and are able to transmit and receive signals and data to and from the PCB 540. The first electrical connector 651 and the second electrical connector 652 may, for example, be coupled to a power transmission line and a signal transmission line. A low current of 250 mA or less may flow through the power transmission line connected to the first electrical connector 651 and the second electrical connector 652.

According to an embodiment, the flexible conductive members 640 may electrically connect the PCB 540 and the flexible PCB 550 to each other. The flexible conductive members 640 may come into contact with a conductive member exposed in an area 634 of the bending area 630, and may come into contact with a conductive member exposed on the first face 541 of the PCB 540. The high-power transmission lines 545a and 545b mounted on the PCB 540 and the flexible conductive members 640 may be connected to each other. The flexible conductive members 640 are disposed between the first face 541 of the PCB 540 and one area 634 of the bending area 630 of the FPCB 550, and may be electrically connected to the PCB 540 and the first electronic component 610 or the second electronic component 620. The flexible conductive members 640 may allow a high current to flow to the high-power transmission line therethrough. The flexible conductive members 640 may supply power to an electronic component requiring a current of about 1 A to 4 A, and may have a thickness that is capable of withstanding a high current. The flexible conductive members 640 are capable of reducing the length of an electrical path thereof. The flexible conductive members 640 may have elasticity, and may elastically support the bending area 630, the first electronic component 610, and the second electronic component 620 of the FPCB 550.

According to an embodiment, the second electrical connector 652 may be engaged with the first electrical connector 651. The second electrical connector 652 may be connected to a power line and a signal line. The second electrical connector 652 may include multiple pins, and the first electrical connector 651 may also include multiple pins corresponding to the multiple pins of the second electrical connector 652 in terms of the number and positions thereof. The pins of the first electrical connector 651 and the second electrical connector 652 may be connected to the signal line and the power line so as to correspond to each other.

According to an embodiment, the first electronic component 610 may be an electronic component that uses a high current, and the second electronic component 620 may be an electronic component that is capable of being driven with a low current. According to an embodiment, the high current may range from 1 A to 4 A, and the low current may be a current lower than the high current range. For example, the low current may not exceed 250 mA.

According to an embodiment, the first electronic component 610 (e.g., the light-emitting element 106 in FIG. 1), which uses a high current may, for example, be an infrared light-emitting diode (LED) or an LED flash. The Infrared LED may be used for a depth camera, and/or may be used for an iris camera. The second electronic component 620 (e.g., the sensor module 104 in FIG. 1), which requires a low current may, for example, be a proximity light sensor, a camera module, or the like.

According to an embodiment, when the first electronic component 610 and the second electronic component 620 are components that need to emit light to the outside or need to sense an external environment, they may be disposed below the first plate 510, which is formed of a transparent member. When the first plate 510 is formed of colored glass or translucent glass, which is a non-transparent member, the first electronic component 610 and the second electronic component 620 may be arranged such that a light-emitting portion or an ultrasonic transmission portion thereof is exposed to the outside. The first electronic component 610 and the second electronic component 620 may be disposed to be spaced apart from the PCB 540, and the PCB 540 may be disposed below the first electronic component 610 and the second electronic component 620.

According to an embodiment, the first electronic component 610 and the second electronic component 620 may be disposed on an upper bezel of the electronic device 500, and may be disposed so as not to overlap the active area of the display. Referring to FIG. 6B, the first plate 510 may include a masked black masking area 555*a* and an active area 555*b*, which transmits light emitted by the display. The black masking area 555*a* may be disposed along the edge of the active area 555*b*, and may be masked such that internal components are not visible to the outside. The FPCB 550 including the first electronic component 610 and the second electronic component 620 may be disposed below the black masking (BM) area 555*a* of the first plate 510, and the display may be disposed in the active area 555*b* located inside the electronic device 500. The BM area 555*a* may not be masked in a portion through which the first electronic component 610 and the second electronic component 620 are exposed. According to an embodiment, the first electronic component 610 may be a light-emitting element, and the second electronic component 620 may be a sensor module. The areas where the light of the sensors 621 and 622 of the second electronic component 620 and the light of the first electronic component 610 are emitted may be exposed to the outside without being masked.

According to various embodiments, the first electronic component 610 and the second electronic component 620 may be attached to an additional PCB 680, and the additional PCB 680 may include multiple electrical connectors 685 and 686, and may be connected to multiple electrical connectors 615 and 625 connected to the bending area 630 of the FPCB 550. The first electronic component 610 and the second electronic component 620 may be electrically connected to the bending area 630 of the FPCB 550 to receive power or to transmit signals or information.

According to various embodiments, in the electronic device 500, the first electronic component 610 and the second electronic component 620 may be mounted on the surface of the bending area 630 of the FPCB 550 using SMT, instead of being connected to the bending area 630 of the FPCB 550 using connectors. According to an embodiment, since the FPCB 550 is flexible, the FPCB 550 may include a support plate 690 for supporting the first electronic component 610 and the second electronic component 620.

According to an embodiment, the bending area 630 of the FPCB 550 may include a first bending portion 631 and a second bending portion 632. One end of the bending area 630 of the FPCB 550 extends from the first electronic component 610 and the second electronic component 620 to face the first face 541 of the PCB 540. The first bending portion 631 and the second bending portion 632 may be bent in an area that does not overlap the first face 541 of the PCB 540. The bending area 630 of the bent FPCB 550 may extend to the second electrical connector 652, and may be coupled with the second electrical connector 652.

According to an embodiment, the bending area 630 of the FPCB 550 may include a power transmission line and a signal transmission line. The bending area 630 of the FPCB 550 may include multiple layers, and each layer may include a power transmission line, a signal transmission line, and a substrate layer. The bending area 630 of the FPCB 550 may include a non-conductive member that surrounds each layer. The non-conductive member forming an envelope of the bending area 630 of the FPCB 550 may be removed from one area 634 of the bending area 630 of the FPCB 550 such that a conductive member electrically connected to the power transmission line can be exposed.

According to an embodiment, the bending area 630 of the FPCB 550 may be spaced apart from the side bezel 520 by a predetermined distance. In the bending area 630 of the FPCB 550, a conductive line may be disposed, and a current may flow. Thus, the bending area 630 may be spaced apart from the side bezel 520, which can be utilized as an antenna radiator.

Figure 7:
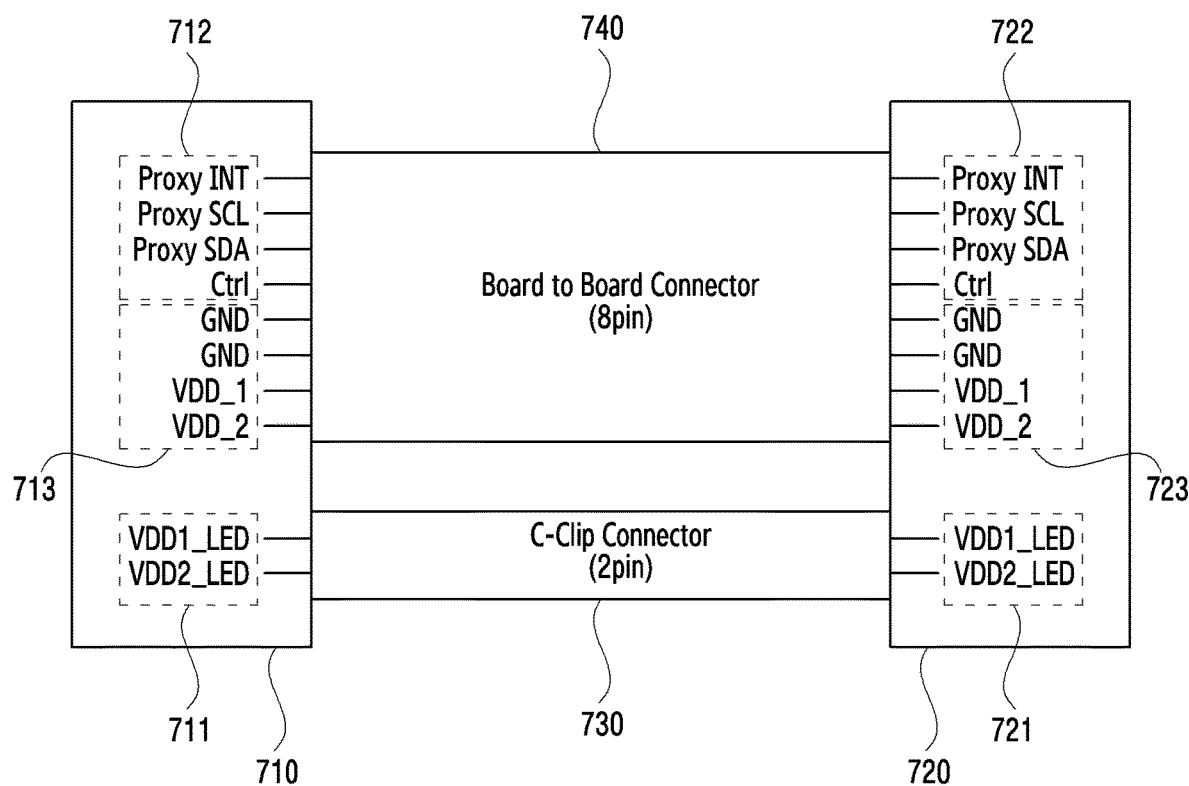
FIG. 7 is a diagram illustrating an example configuration of an electronic device connector according to an embodiment.

FIG. 7 is a diagram illustrating an example configuration of an electronic device connector according to an embodiment.

Referring to FIG. 7, a FPCB 710 (e.g., the FPCB 550 in FIG. 5) and a PCB 720 (e.g., the PCB 540 in FIG. 5) may be connected to each other through a board-to-board connector (B2B connector) 740 (e.g., the first electrical connector 651 and the second electrical connector 652) and a flexible conductive member 730.

According to an embodiment, the FPCB 710 may include a high-power transmission line 711, a low-power transmission line 713, a signal transmission line 712, and the PCB 720 may include a high-power transmission line 721, a low-power transmission line 723, and/or a signal transmission line 722.

According to an embodiment, the high-power transmission lines 711 and 721 are electrically connected to each other by a flexible conductive member 730, and high current of, for example, 1 A to 4 A is supplied to an electronic component that requires a high current, among the first electronic component 610 and the second electronic component 620, from the PCB 720 through the flexible conductive member 730 and the FPCB 710.

According to an embodiment, the low-power transmission lines 713 and 723 and the signal transmission lines 712 and 722 may be connected to the B2B connector 740. The low-power transmission lines 713 and 723 are electrically connected to each other by the B2B connector 740, and a low current of, for example, 250 mA or less is supplied to an electronic component that requires a low current among the first electronic component 610 and the second electronic component 620 from the PCB 720 through the B2B connector 740 and the FPCB 710. According to an embodiment, the signal transmission lines 712 and 722 are electrically connected by the B2B connector 740, and a signal transmitted from a processor, memory, or the like of the PCB 720 may be transmitted to the first electronic component 610 and the second electronic component 620 from the PCB 720 through the B2B connector 740 and the FPCB 710. Signals transmitted from the first electronic component 610 and the second electronic component 620 may be transmitted from the FPCB 710 to the processor or memory through the B2B connector 740 and the PCB 720.

According to various embodiments, the connectors for connecting the high-power transmission lines 711 and 721 and the low-power transmission lines 713 and 723 may be separately provided, and the connector used for transmitting high power may be manufactured to withstand a high current.

According to an embodiment, the high-power transmission line 711 of the FPCB 710 may be directly connected to the conductors of the PCB 720 through the flexible conductive member 730, and may quickly dissipate heat generated from electronic components. According to various embodiments, the B2B connector 740 connected to the low-power transmission lines 713 and 723 and the flexible conductive member 730 connected to the high-power transmission lines 711 and 721 may be formed separately. Even if the low-power transmission lines 713 and 723 are formed around the bezel of the electronic device, which is used as an antenna, high power is capable of being transmitted through the flexible conductive member 730 to improve antenna performance, and the heat generated from the electronic device using a high current is capable of being easily discharged to the conductor of the FPCB through the flexible conductive member 730 in the form of a short pin.

Figure 8:
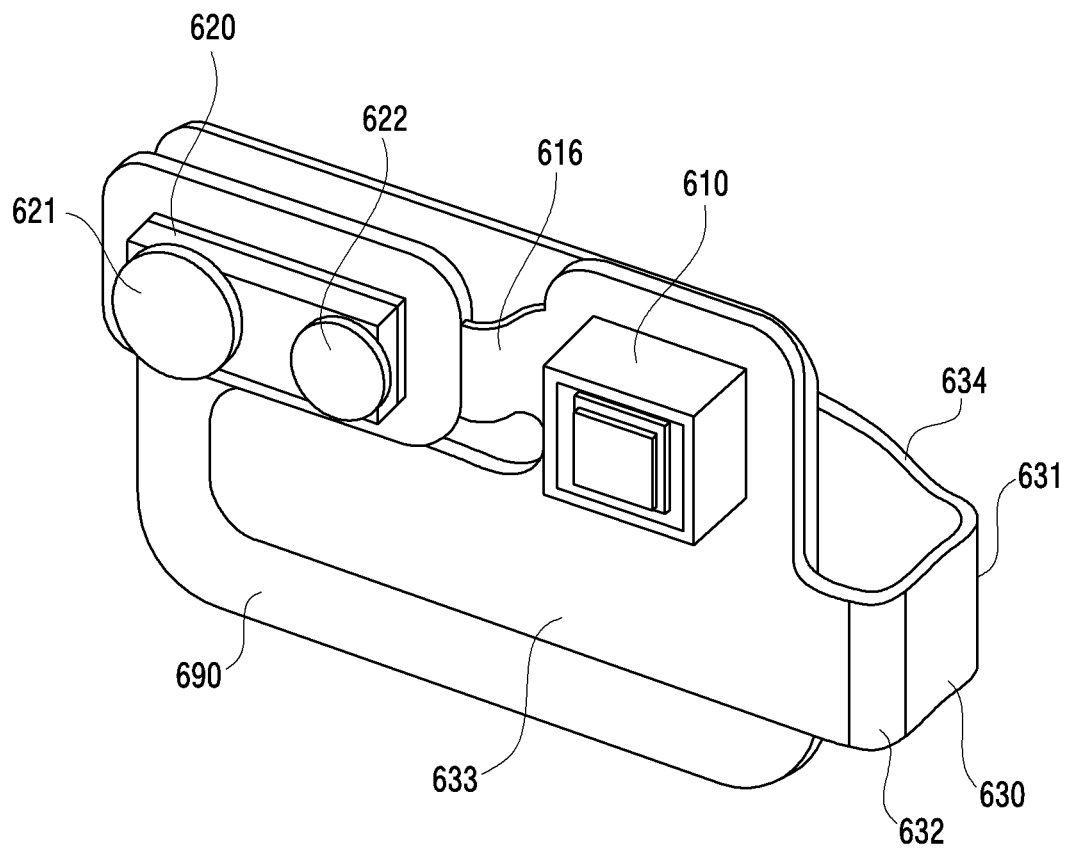
FIG. 8 is a perspective view of an example FPCB according to an embodiment.
Figure 9:
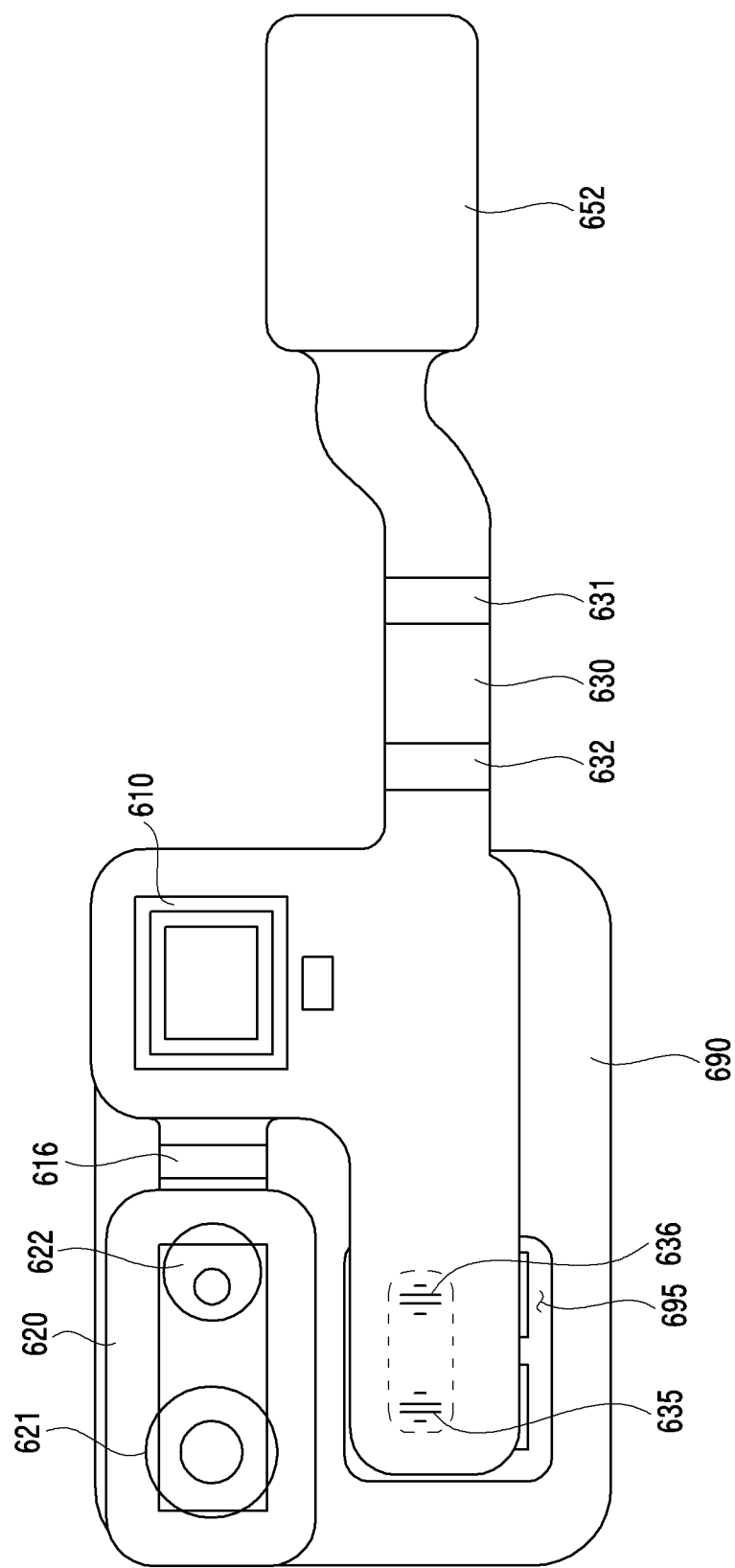
FIG. 9 is a plan view of an example FPCB according to an embodiment in an unfolded state.

FIG. 8 is a perspective view illustrating an example FPCB according to an embodiment, and FIG. 9 is a plan view of an example FPCB in an unfolded state according to an embodiment.

Referring to FIG. 8, the FPCB may include a first electronic component 610, a second electronic component 620, a bending area 630 of an FPCB, and a support plate 690.

According to an embodiment, the first electronic component 610 may be a high-power electronic component that requires a high current. The first electronic component 610 may, for example, and without limitation, be an LED flash, an infrared LED, or the like, that requires high power. The second electronic component 620 may, for example, be a sensor that requires low power, such as, for example, and without limitation, a proximity light sensor, a proximity sensor, or the like. Depending on sensor requirements, the second electronic component 620 may include multiple sensors 621 and 622. The first electronic component 610 and the second electronic component 620 may be connected to the bending area 630. According to an embodiment, the first electronic component 610 and the second electronic component 620 may be mounted on the surface of the first area 633 of the bending area 630. The first electronic component 610 and the second electronic component 620 may be configured to be bonded to the surface of the bending area 630 using surface-mount technology. The first electronic component 610 and the second electronic component 620 may be coupled by a connection portion 616 of the bending area 630. The connection portion 616 may also be made of a flexible material and may be deformed. The first electronic component 610 and the second electronic component 620 having different heights may be arranged at different heights by the deformation of the connection portion 616, whereby it is possible to make the first electronic component 610 and the second electronic component 620 flush with the plane of the lower face of the first plate 510. The support plate 690 may fix the positions of the first electronic component 610 and the second electronic component 620, and may support the first electronic component 610 and the second electronic component 620. The support plate 690 may be configured as a structure having predetermined rigidity using aluminum, stainless steel, or the like.

According to an embodiment, the bending area 630 may include a first bending portion 631 and a second bending portion 632. The first bending portion 631 and the second bending portion 632 may facilitate deformation of the bending area 630. The position of a second electrical connector 652 provided at an end of the bending area 630 is easily deformable, and is deformable depending on the mounting position of the PCB 540. According to various embodiments, a single module including the first electronic component 610 and the second electronic component 620 may be produced. The first electronic component 610 and the second electronic component 620 may be mounted on various types of PCBs.

Referring to FIG. 9, the FPCB 550 may be disposed in the state in which the first bending portion 631 and the second bending portion 632 are unfolded. When the first electrical connector 651 is disposed on one face of the PCB 540 and the flexible conductive members 640 are disposed on the same face, the flexible conductive members 640 and the FPCB 550 may be electrically connected to each other.

According to an embodiment, the support plate 690 may include an opening 695. The flexible conductive members 640 disposed on the printed circuit board 540 may come into contact with the first and second conductive members 635 and 636 of the FPCB 550, which are exposed through the opening 695.

Figure 10A:
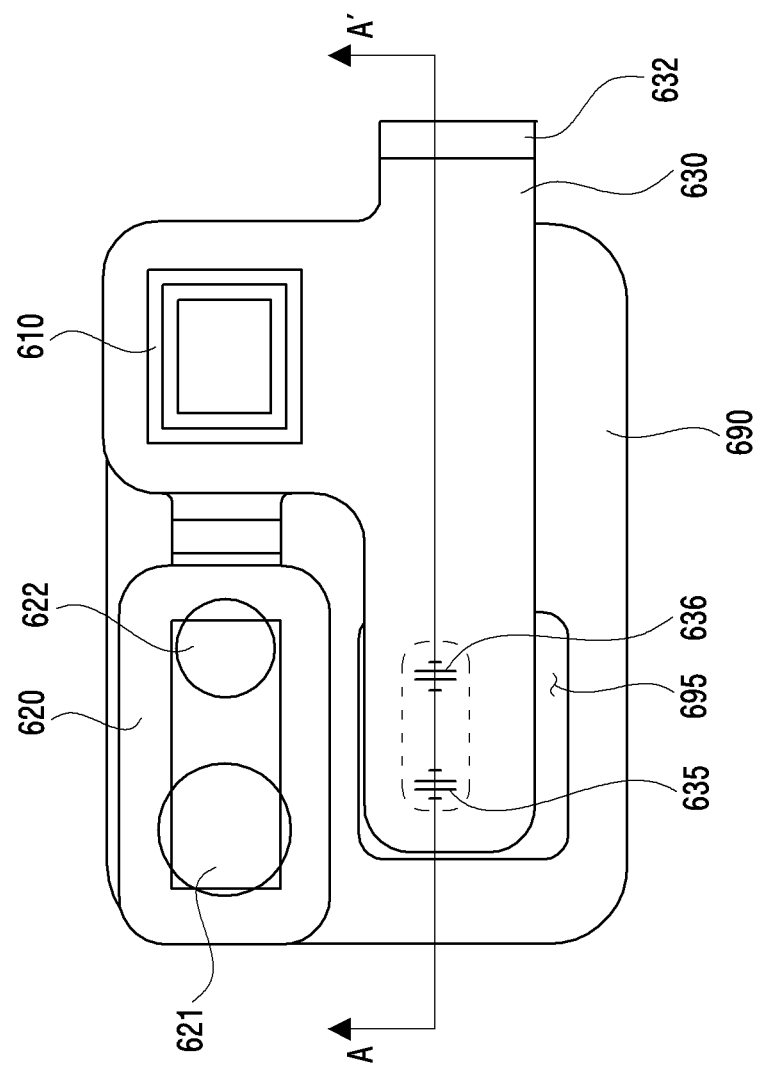
FIG. 10A is a plan view of an example FPCB in a folded state according to an embodiment.
Figure 10B:
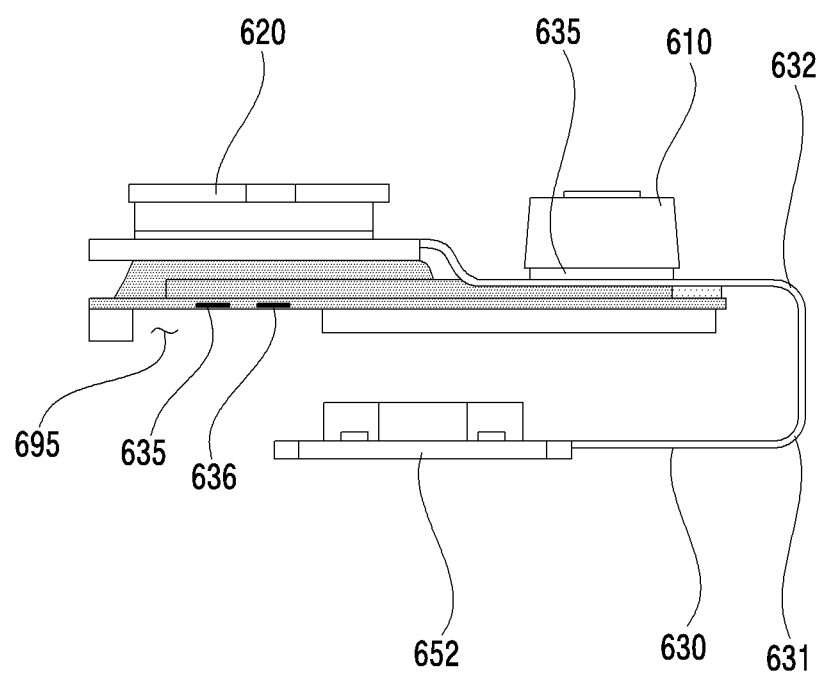
FIG. 10B is a cross-sectional view taken along line A-A' in the FPCB of FIG. 10A.

FIG. 10A is a plan view illustrating an example FPCB in a folded state according to an embodiment, and FIG. 10B is a cross-sectional view taken along line A-A' in the FPCB of FIG. 10A.

Referring to a cross section including the first and second conductive members 635 and 636 of FIGS. 10A and 10B, the first and second conductive members 635 and 636 are located in an area overlapping the opening 695, and are exposed through the opening 695. The first conductive member 635 and the second conductive member 636 may be connected to the high-power transmission lines 545a and 545b of the FPCB 550 (see FIG. 6A). A PCB may be disposed below the first conductive member 635 and the second conductive member 636. The flexible conductive members 640 may be disposed between the PCB and the first and second conductive members 635 and 636 to be connected to the first and second conductive members 635 and 636.

According to an embodiment, an anode may be coupled to the first conductive member 635 and a cathode may be coupled to the second conductive member 636 so as to supply power to the first electronic component 610 along the high-power transmission line.

According to an embodiment, heat generated in the first electronic component 610 may be dissipated to the PCB through the flexible conductive members 640.

Figure 11A:
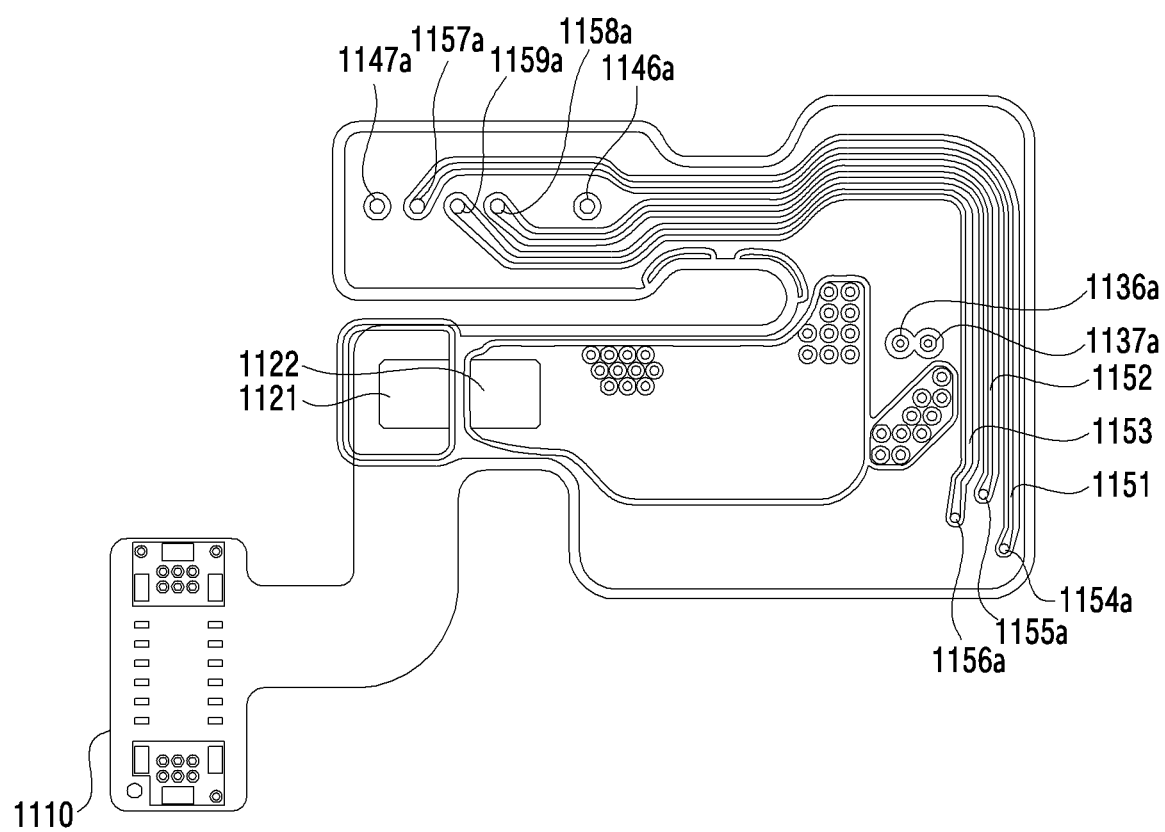
FIG. 11A is a diagram illustrating a layer of an example FPCB according to an embodiment.
Figure 11B:
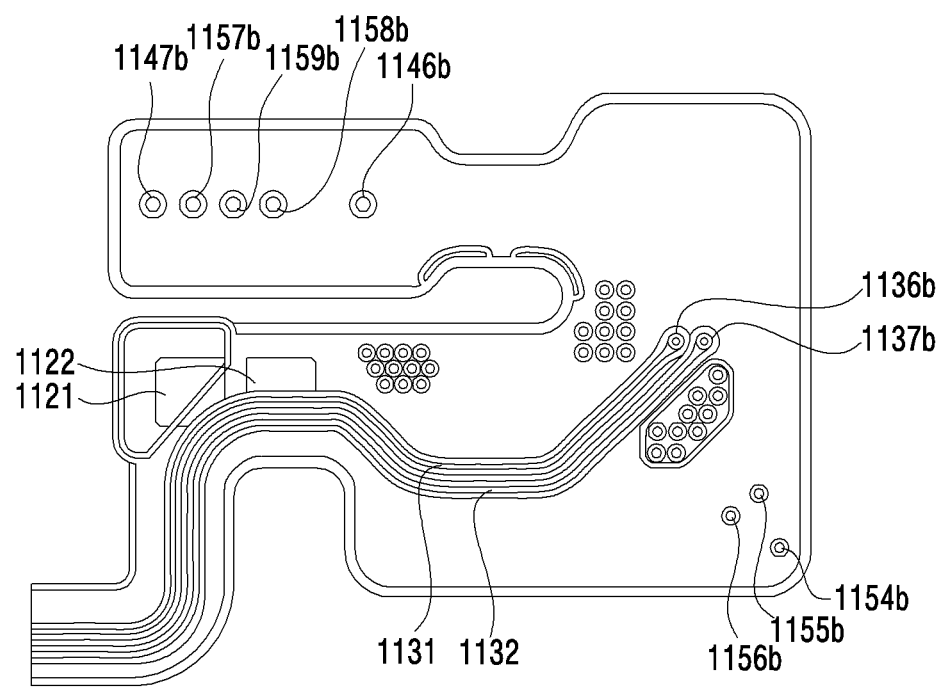
FIG. 11B is a diagram illustrating another layer of the FPCB according to an embodiment.
Figure 11C:
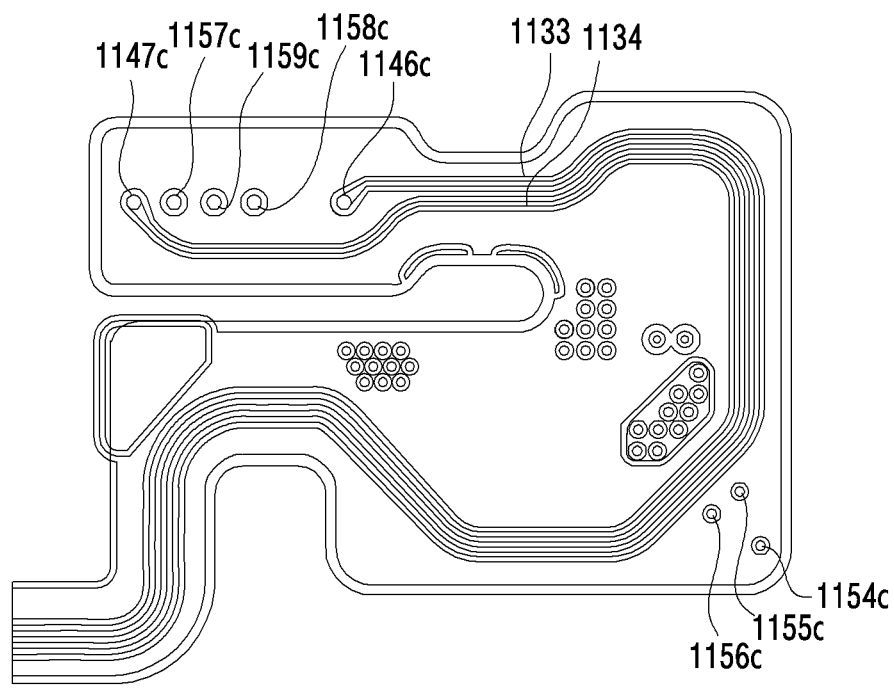
FIG. 11C is a diagram illustrating still another layer of the FPCB according to an embodiment.
Figure 11D:
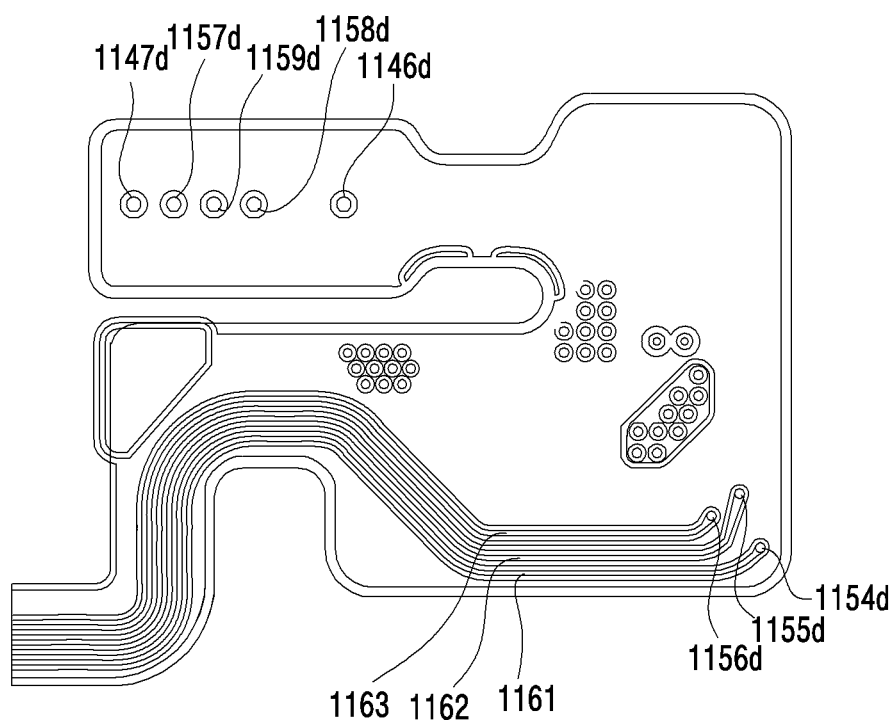
FIG. 11D is a diagram illustrating yet another layer of the FPCB according to an embodiment.

FIG. 11A is a diagram illustrating an example layer of an FPCB according to an embodiment, FIG. 11B is a diagram illustrating another layer of the FPCB, FIG. 11C is a diagram illustrating still another layer of the FPCB, and FIG. 11D is a diagram illustrating yet another layer of the FPCB.

Referring to FIG. 11A, a first layer of the FPCB 550 may include a second electrical connector 1110 and signal transmission lines 1151, 1152, and 1153. The first layer of the FPCB 550 may include input terminal vias 1154a, 1155a, and 1156a and output terminal vias 1157a, 1158a, and 1159a of the signal transmission lines 1151, 1152, and 1153. The first layer of the FPCB 550 may include high-power transmission line terminal vias 1136a and 1137a and low-power transmission line terminal vias 1146a and 1147a. A signal supplied through a signal transmission line in a fourth layer of the FPCB 550 of FIG. 11D, which will be described later, may be transmitted to an electronic component through the first layer. Two openings 1121 and 1122 may be provided in order to couple the flexible conductive members 640 and high-power transmission lines.

Referring to FIG. 11B, a second layer may include high-power transmission lines 1131 and 1132. The high-power transmission lines 1131 and 1132 may come into contact with the flexible conductive members 640 through the two openings 1121 and 1122, and may be electrically connected to the flexible conductive members 640 so as to supply power to electronic components.

The second layer of the FPCB 550 may include input terminal vias 1154b, 1155b, and 1156b and output terminal vias 1157b, 1158b, and 1159b of the signal transmission lines 1151, 1152, and 1153 in the first layer. The second layer of the FPCB 550 may include low-power transmission line terminal vias 1146b and 1147b. The high-power transmission line terminal vias 1136b and 1137b may be located in an area corresponding to the ends of the high-power transmission lines 1131 and 1132.

Referring to FIG. 11C, a third layer of the FPCB 550 may include low-power transmission lines 1133 and 1134. The low-power transmission lines 1133 and 1134 are able to transmit a current of, for example, 250 mA or less, and may be connected to an electronic component consuming low power through vias 1146c and 1147c formed at one ends of the low-power transmission lines 1133 and 1134. The other ends of the low-power transmission lines 1133 and 1134 may be connected to the second electrical connector 1110.

According to an embodiment, the third layer of the FPCB 550 may include input terminal vias 1154c, 1155c, and 1156c and output terminal vias 1157c, 1158c, and 1159c of the signal transmission lines 1151, 1152, and 1153 in the first layer.

Referring to FIG. 11D, the fourth layer of the FPCB 550 may include signal transmission lines 1161, 1162, and 1163. One ends of the signal transmission lines 1161, 1162, and 1163 are connected to the second electrical connector 1110, and the other ends of the signal transmission lines 1161, 1162, and 1163 are connected to the input terminal vias 1154d, 1155d, and 1156d of the signal transmission lines 1151, 1152, and 1153.

According to an embodiment, the fourth layer of the FPCB 550 may include output terminal vias 1157d, 1158d, and 1159d of the signal transmission lines 1161, 1162, and 1163 in the first layer and terminal vias 1147d and 1146d of the low-power transmission lines.

An electronic device according to various example embodiments described above may include: a housing including a first plate oriented in a first direction, a second plate oriented in a second direction opposite the first direction, and a side face that surrounds the space between the first plate and the second plate; a first PCB disposed in the space and including a first face oriented in the first direction, a second face oriented in the second direction, and a first electrical connector on the first face; a second PCB disposed in the space closer to the second plate than the first PCB, and including a second electrical connector; a third electrical connector detachably coupled to the first electrical connector; a fourth electrical connector detachably coupled to the second electrical connector; an FPCB electrically connected between the third electrical connector and the fourth electrical connector, and including a first portion facing the second face; and a flexible conductive member comprising a conductor disposed between the second face and the first portion.

According to various embodiments, the FPCB may be bent along a side wall of the first PCB from the first face, and may extend along the second face.

According to various embodiments, the flexible conductive member may be electrically connected between a first conductive portion exposed on the second face and a second conductive portion exposed to the first portion of the FPCB.

According to various embodiments, the first PCB may include at least one of an LED and a proximity sensor on the first face.

According to various embodiments, the electronic device may further include a display disposed in the space and visible through at least a portion of the first plate.

According to various embodiments, the second PCB may be disposed between the display and the second plate.

An electronic device according to various embodiments may include: a housing including an inner space; a PCB disposed in the inner space and having a plate shape including a first face and a second face, the PCB including a first electrical connector disposed on the first face; an FPCB including a second electrical connector coupled to the first electrical connector and connected to an end thereof, and an electronic component electrically connected to the PCB and spaced apart from the second face; and a flexible conductive member comprising a conductor disposed between the second face and the FPCB. The second electrical connector may be electrically connected to a signal transmission line and a first power transmission line, and the flexible conductive member may be electrically connected to a second power transmission line.

According to various embodiments, the current supplied through the second power transmission line may be higher than the current supplied through the first power transmission line.

According to various embodiments, the FPCB may extend from the second electrical connector to an edge of the PCB, may be spaced apart from an inner side wall of the housing, may be bent along the edge of the PCB, and may extend along the second face.

According to various embodiments, the FPCB may include multiple layers.

According to various embodiments, a first layer of the FPCB may include the second power transmission line and a metal plate for heat dissipation.

According to various embodiments, a second layer of the FPCB may include the first power transmission line and the signal transmission line.

According to various embodiments, a second layer of the FPCB may include the first power transmission line, and a third layer of the FPCB may include the signal transmission line.

According to various embodiments, the FPCB may further include an insulating member surrounding the multiple layers.

According to various embodiments, the insulating member may include an opening at a position corresponding to the flexible conductive member so as to expose a portion of the second power transmission line.

According to various embodiments, the electronic component may include a proximity light sensor and an IR LED.

According to various embodiments, the proximity light sensor and the IR LED may be exposed to the outside through a portion of the housing.

According to various embodiments, the housing may include a transparent plate enclosing a face of the housing in which the proximity light sensor and the IR LED are exposed.

According to various embodiments, the IR LED may be connected to the second power transmission line.

According to various embodiments, the first electrical connector and the second electrical connector may be board-to-board (B2B) connectors.

In the above-described example embodiments of the disclosure, a component included in the disclosure may be expressed in the singular or the plural according to an example embodiment. However, the singular form or plural form is selected for convenience of description suitable for the presented situation, and various example embodiments of the disclosure are not limited to a single element or multiple elements thereof. Further, either multiple elements expressed in the description may be configured into a single element or a single element in the description may be configured into multiple elements.

While the disclosure has been illustrated and described with reference to certain embodiments thereof, it will be understood by those skilled in the art that various changes in form and details may be made therein without departing from the scope of the disclosure. Therefore, the scope of the disclosure should not limited to the illustrated example embodiments, but may be defined, for example, by the appended claims and equivalents thereof.

What is claimed is:

1. An electronic device comprising:
   a housing including a first plate oriented in a first direction, a second plate oriented in a second direction opposite the first direction, and a side face surrounding a space between the first plate and the second plate;
   a first printed circuit board (PCB) disposed in the space and including a first face oriented in the first direction, a second face oriented in the second direction, and a first electrical connector disposed on the first face;
   a second PCB disposed in the space between the second plate and the first PCB and closer to the second plate than the first PCB, and including a second electrical connector;
   a third electrical connector detachably coupled to the first electrical connector;
   a fourth electrical connector detachably coupled to the second electrical connector;
   a flexible printed circuit board (FPCB) electrically connected between the third electrical connector and the fourth electrical connector, and including a first portion facing the second face of the first PCB and a second portion facing the first face of the first PCB; and
   a flexible conductive member comprising a conductor disposed between the second face of the first PCB and the first portion of the FPCB.

2. The electronic device of claim 1, wherein the FPCB is bent along a side wall of the first PCB and extending from the first face along the second face.

3. The electronic device of claim 1, wherein the flexible conductive member is electrically connected between a first conductive portion exposed on the second face of the first PCB and a second conductive portion exposed to the first portion of the FPCB.

4. The electronic device of claim 1, wherein the second PCB includes at least one of an LED and a proximity sensor on a first face of the second PCB.

5. The electronic device of claim 1, further comprising:
   a display disposed in the space and visible through at least a portion of the first plate.

6. The electronic device of claim 5, wherein the second PCB is disposed between the display and the second plate.

7. An electronic device comprising:
   a housing including an inner space;
   a printed circuit board (PCB) disposed in the inner space and having a plate shape including a first face and a second face, the PCB including a first electrical connector disposed on the first face;
   a flexible printed circuit board (FPCB) including a second electrical connector coupled to the first electrical connector and connected to an end thereof, and an electronic component electrically connected to the PCB, disposed adjacent to the second face of the PCB and spaced apart from the second face of the PCB; and
   a flexible conductive member comprising a conductor disposed between the second face and the FPCB,
   wherein the second electrical connector is electrically connected to a signal transmission line and a first power transmission line, and the flexible conductive member is electrically connected to a second power transmission line.

8. The electronic device of claim 7, wherein a current supplied through the second power transmission line is higher than a current supplied through the first power transmission line.

9. The electronic device of claim 7, wherein the FPCB extends from the second electrical connector to an edge of the PCB, the FPCB is spaced apart from an inner side wall of the housing, the FPCB is bent along the edge of the PCB, and the FPCB extends along the second face.

10. The electronic device of claim 7, wherein the FPCB comprises multiple layers.

11. The electronic device of claim 10, wherein a first layer of the FPCB includes the second power transmission line and a metal plate configured to dissipate heat.

12. The electronic device of claim 11, wherein a second layer of the FPCB includes the first power transmission line and the signal transmission line.

13. The electronic device of claim 11, wherein a second layer of the FPCB includes the first power transmission line and a third layer of the FPCB includes the signal transmission line.

14. The electronic device of claim 10, wherein the FPCB further includes an insulating member comprising an insulating material surrounding the multiple layers.

15. The electronic device of claim 14, wherein the insulating member includes an opening at a position corresponding to the flexible conductive member exposing a portion of the second power transmission line.

16. The electronic device of claim 7, wherein the electronic component includes a proximity light sensor and an IR LED.

17. The electronic device of claim 16, wherein the proximity light sensor and the IR LED are exposed to an outside through a portion of the housing.

18. The electronic device of claim 17, wherein the housing includes a transparent plate enclosing a face of the housing in which the proximity light sensor and the IR LED are exposed.

19. The electronic device of claim 16, wherein the IR LED is connected to the second power transmission line.

20. The electronic device of claim 7, wherein the first electrical connector and the second electrical connector are board-to-board (B2B) connectors.

* * * * *